US009490240B2

(12) United States Patent
Lucero et al.

(10) Patent No.: US 9,490,240 B2
(45) Date of Patent: Nov. 8, 2016

(54) FILM INTERPOSER FOR INTEGRATED CIRCUIT DEVICES

(71) Applicant: INTEL CORPORATION, Santa Clara, CA (US)

(72) Inventors: Alan E. Lucero, Tempe, AZ (US); Alan E. Johnson, Phoenix, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 777 days.

(21) Appl. No.: 13/631,814

(22) Filed: Sep. 28, 2012

(65) Prior Publication Data

US 2014/0092576 A1  Apr. 3, 2014

(51) Int. Cl.
*H01L 25/16* (2006.01)
*H05K 1/02* (2006.01)

(52) U.S. Cl.
CPC ......... *H01L 25/167* (2013.01); *H01L 2224/16* (2013.01); *H01L 2924/0002* (2013.01); *H05K 1/0274* (2013.01); *H05K 2201/10378* (2013.01)

(58) Field of Classification Search
CPC .............. H01L 25/167; H05K 1/0274; H05K 2201/0378
USPC .......................... 257/686, 774–775, 778–781
See application file for complete search history.

(56) References Cited

U.S. PATENT DOCUMENTS

| | | | |
|---|---|---|---|
| 5,568,574 A | 10/1996 | Tanguay, Jr. et al. | |
| 6,093,938 A | 7/2000 | Minemier et al. | |
| 6,229,158 B1 | 5/2001 | Minemier et al. | |
| 6,450,699 B1 | 9/2002 | Murali et al. | |
| 6,973,110 B2 | 12/2005 | Althaus et al. | |
| 7,239,767 B2 * | 7/2007 | Kim ......................... G02B 6/42 | |
| | | | 385/14 |
| 7,271,461 B2 | 9/2007 | Dutta | |
| 7,324,716 B2 | 1/2008 | Epitaux | |
| 7,413,995 B2 | 8/2008 | Sterrett et al. | |
| 7,592,704 B2 | 9/2009 | Sterrett et al. | |
| 7,734,123 B2 | 6/2010 | Bar et al. | |
| 7,847,411 B2 | 12/2010 | Takaike | |

(Continued)

FOREIGN PATENT DOCUMENTS

| | | |
|---|---|---|
| CN | 102656493 | 9/2012 |
| KR | 20030007311 | 1/2003 |
| KR | 20060080236 | 7/2006 |

OTHER PUBLICATIONS

Wikipedia Definition of Interposer.*

(Continued)

*Primary Examiner* — Jeremy C Norris
*Assistant Examiner* — Ahmad D Barnes
(74) *Attorney, Agent, or Firm* — Konrad Raynes Davda & Victor LLP (57) ABSTRACT

In one embodiment, a stack device comprising a film interposer of a polyimide film material, for example, is assembled. In accordance with one embodiment of the present description, a front side of the film interposer is attached to a first element of the stack device, which may be an integrated circuit package, an integrated circuit die, a substrate such as a printed circuit board, or other structure used to fabricate electronic devices. In addition, a back side of the film interposer is attached to a second element which like the first element, may be an integrated circuit package, an integrated circuit die, a substrate such as a printed circuit board, or other structure used to fabricate electronic devices. Other aspects are described.

21 Claims, 9 Drawing Sheets

(56) References Cited

U.S. PATENT DOCUMENTS

| | | | |
|---|---|---|---|
| 7,851,811 B2* | 12/2010 | Dutta | G02B 6/12002 257/432 |
| 8,774,570 B2 | 7/2014 | Choi | |
| 8,865,489 B2 | 10/2014 | Rogers et al. | |
| 2003/0146017 A1 | 8/2003 | Fan et al. | |
| 2004/0008952 A1 | 1/2004 | Kragl | |
| 2005/0100264 A1 | 5/2005 | Kim et al. | |
| 2005/0207458 A1 | 9/2005 | Zheng | |
| 2006/0093369 A1 | 5/2006 | Nagarajan | |
| 2007/0297713 A1 | 12/2007 | Lu et al. | |
| 2009/0180732 A1 | 7/2009 | Takai et al. | |
| 2010/0006784 A1 | 1/2010 | Mack et al. | |
| 2010/0111473 A1 | 5/2010 | Pinguet et al. | |
| 2010/0151614 A1 | 6/2010 | Darbinyan et al. | |
| 2011/0019960 A1 | 1/2011 | Matsubara et al. | |
| 2011/0044367 A1 | 2/2011 | Budd et al. | |
| 2012/0099820 A1 | 4/2012 | Rolston et al. | |
| 2013/0279844 A1 | 10/2013 | Na et al. | |
| 2014/0029639 A1 | 1/2014 | Zarbock et al. | |
| 2014/0091349 A1 | 4/2014 | Diana et al. | |

OTHER PUBLICATIONS

Collin's Definition of Printed Circuit Board.*
Denselight Semiconductors, "Uncooled High Power Semiconductor Laser Diode", DL-UCS/UPS/UPM Series, retrieved on Dec. 6, 2011, 2 pp.
Innovative Photonic Solutions, "The IPS Standard 14-Pin Butterfly Package", [online], [retrieved on Dec. 7, 2011], retrieved from the Internet at <URL: http://www.innovativephotonics.com/14-Pin_BF.htm>, 1 pp.
Intel Corporation, "Intel Research- Photonics", retrieved on Dec. 6, 2011, 4 pp.
Myslewski, R., "Intel Unfurls Copper-Killing Optical Cables", [online], Sep. 23, 2009, [retrieved on Dec. 6, 2011], retireved from the Internet at <URL: http://www.theregister.co.uk/2009/09/23/light_peak/., 2 pp.
International Preliminary Report on Patentability (IPRP) for International Application No. PCT/US2011/067653, dated Jul. 10, 2014, 6 pp.
International Search Report and Written Opinion for International Application No. PCT/US2011/067653, dated Jul. 16, 2012, 9 pp.
Thorlabs, Inc., "Butterfly Laser Diode Mount", LM14S2, Operating Manual, Feb. 20, 2009, 15 pp.
Thorlabs, Inc., "Butterfly Laser Diode Mounts"[online], Updated May 6, 2009, [retrieved on Dec. 6, 2011], retrieved from the Internet at <URL: http://www.thorlabs.de/NewGroupPage9.cfm?ObjectGroup_ID=1558>, 2 pp.
Wikipedia, "Hybrid Silicon Laser", [online], Updated May 19, 2010, [retrieved Dec. 6, 2011], Retrieved from the Internet at <URL: http://en.wikipedia.org/w/index.php?oldid=362912178>, 3 pages.
Wikipedia, "Optical Interconnect", [online], Updated Oct. 22, 2011, [retrieved Dec. 6, 2011], Retrieved from the Internet at <URL: http://en.wikipedia.org/w/index.php?oldid=456894125>, 2 pp.
Wikipedia, "Silicon Photonics", [online], Updated Nov. 29, 2011, [retrieved Dec. 6, 2011], Retrieved from the Internet at <URL: http://en.wikipedia.org/w/index.php?oldid=463171777>, 7 pp.
Intel Corporation, "Introduction", 1999 Packaging Databook, Chapter 1, 18 pp.
Intel Corporation, "Introduction", 2000 Packaging Databook, Chapter 12, 34 pp.
Networking & Multimedia Group, "Manufacturing with the Land Grid Array Package", Freescale Semiconductor, Inc., Application Note, Document No. AN2920, Rev. 2, Dec. 2008, 16 pp.
Wikipedia, "Ball Grid Array", [online], last modified Aug. 26, 2012, [retrieved on Sep. 5, 2012], retrieved from the Internet at <URL: http://en.wikipedia.org/wiki/Ball_grid_array>, 5 pp.
Wikipedia, "Polyimide", [online], last modified Jul. 19, 2012, [retrieved on Sep. 16, 2012], retrieved from the Internet at <URL: http://en.wikipedia.org/wiki/Polyimide>, 3 pp.
Restriction Requirement, Dec. 26, 2014, for U.S. Appl. No. 13/976,419, filed Jun. 26, 2013 by E.A. Zarbock et al., Total 10 pp.
Response to Restriction Requirement, Feb. 25, 2015, for U.S. Appl. No. 13/976,419, filed Jun. 26, 2013 by E.A. Zarbock et al., Total 7 pp.
U.S. Pat. No. 7,847,411, dated Dec. 7, 2010, is an English Language Equivalent of KR Publication No. 20060080236, dated Jul. 7, 2006.
Office Action 1 for U.S. Appl. No. 13/976,419, dated May 1, 2015, 27 pp.
International Search Report for International Application No. PCT/US2013/048371, dated Sep. 30, 2013, 3 pp.
Written Opinion for International Application No. PCT/US2013/048371, dated Sep. 30, 2013, 6 pp.
International Preliminary Report on Patentability for International Application No. PCT/US2013/048371, dated Apr. 9, 2015, 8 pp.
Response to Office Action 1 for U.S. Appl. No. 13/976,419, dated Aug. 3, 2015, 9 pp.
Final Office Action 1 for U.S. Appl. No. 13/976,419, dated Sep. 22, 2015, 16 pp.
Response to Final Office Action 1 for U.S. Appl. No. 13/976,419, dated Nov. 23, 2015, 9 pp.
Office Action 1 for CN Application No. 201380004552.3, dated May 3, 2016, 9 pp.
U.S. Pat. No. 8,774,570, dated Jul. 8, 2014, is an English language equivalent of CN Publication No. 102656493, dated Sep. 5, 2012.
Response to Office Action 3 for U.S. Appl. No. 13/976,419, dated May 2, 2016, 10 pp.
Office Action 1 for CN Application No. 2013800045523, dated May 3, 2016, 13 pp. (English Translation).
Final Office Action 2 for U.S. Appl. No. 13/976,419, dated Jul. 8, 2016, 18 pp.
Response to Final Office Action 2 for U.S. Appl. No. 13/976,419, dated Sep. 8, 2016, 8 pp.

* cited by examiner

FILM INTERPOSER FOR INTEGRATED CIRCUIT DEVICES

BACKGROUND

Description of Related Art

Photonic components, such as, but not limited to, photon emitters such as laser transmitters, photon detectors such as laser receivers, array waveguides, amplifiers, couplers, splitters, and other devices for carrying light-based ("photonic") signals have often been manufactured using a different process than that for silicon based semiconductors. Thus, electronic components and photonic components have been manufactured on separate substrates using different processes and then interfaced together. However, more recently, advances have been made in fabricating photonic devices using manufacturing processes designed for silicon based semiconductors. Accordingly, efforts continue to integrate photonic components in integrated circuits.

Thus, integrated circuits may now include optical or photonic elements in addition to various active and passive circuit elements, as well, which have been integrated into a piece of semiconductor material, often referred to as a die. The die may, in turn, be encapsulated into a package, which often includes a ceramic or plastic substrate although other materials may be used. These packages are usually attached to a printed circuit board, often by connecting pins arranged along the periphery of the package. In this manner, an electronic system can be assembled by connecting various integrated circuit packages to a printed circuit board.

In addition to mechanically connecting the integrated circuit package to the printed circuit board, the connecting pins also typically provide separate electrical connection terminals between the printed circuit board and the various inputs and outputs of the integrated circuit within the package. To increase the number of connection terminals, other package designs have been utilized. For example, in the pin grid array (PGA) and ball grid array (BGA) packages, a large number of input/output (I/O) connection terminals are disposed in a two dimensional array over a substantial portion of a major surface of the package.

To increase space utilization, two or more integrated circuit dies may be attached to a printed circuit board in a stacked arrangement. The dies may be interconnected in a die-to-die stacked arrangement. Alternatively, each die may be placed in a package and the two packages may be stacked in a package-to-package arrangement.

Interposers may also be used to provide die-to-die or die-to-package substrate interconnections in a stack. An interposer typically includes a generally rectangular ring-shaped frame which may be constructed of a dielectric material such as plastic or ceramic, for example. The frame has a plurality of apertures distributed about its periphery into which plugs may be punched into the frame apertures and secured therein in an interference fit. The plugs are typically formed of an electrically conductive material such as copper and may each be bonded to aligned contact pads of the die or package substrates. The copper plugs of the interposer may be bonded to the contact pads using stencil printed solder or other materials including electroplated solder, ink jet solder or adhesives or using other bonding techniques including thermocompression and thermosonic joining.

Each plug can provide a separate electrical interconnection between packages or dies. The center to center spacing or "pitch" between adjacent force fit plugs may be as low as 300 microns, in some applications. The inputs and outputs of a stack may be electrically connected to a printed circuit board using connection pins, solder bumps or other connection terminals.

BRIEF DESCRIPTION OF THE DRAWINGS

Referring now to the drawings in which like reference numbers represent corresponding parts throughout.

DETAILED DESCRIPTION OF THE ILLUSTRATED EMBODIMENTS

In the following description, reference is made to the accompanying drawings which form a part hereof and which illustrate several embodiments of the present disclosure. It is understood that other embodiments may be utilized and structural and operational changes may be made without departing from the scope of the present description.

Figure 1:
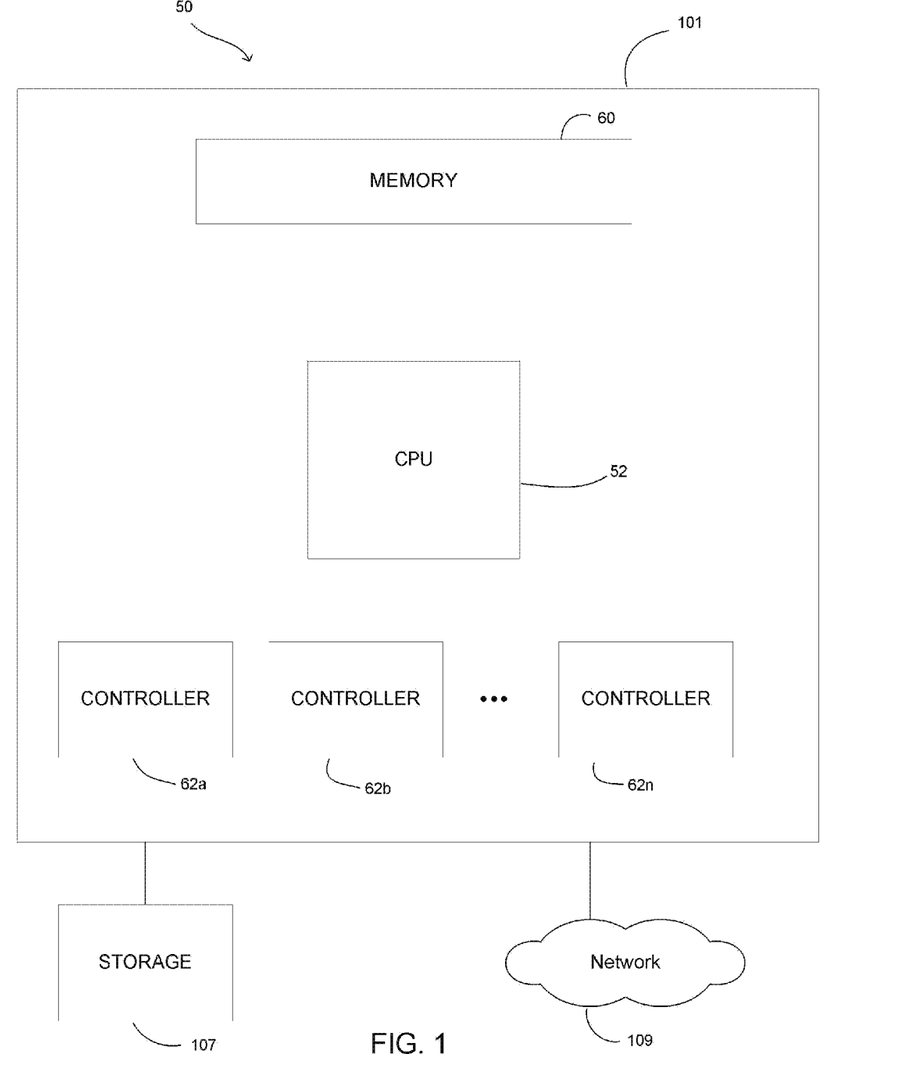
FIG. 1 illustrates one example of a computing environment in which aspects of the description provided herein may be embodied.

FIG. 1 illustrates a computing environment in which aspects of described embodiments may be embodied. A computer 50 includes one or more central processing units (CPU) 52 (only one is shown), a memory 60 and a plurality of controllers 62a, 62b . . . 62n. Each of the CPU 52, and controllers 62a, 62b . . . 62n include one or more electronic devices. Once such electronic device is represented by an electronic device 100 (FIG. 2) which is electrically and mechanically coupled to a printed circuit board 101. The device 100 of this embodiment includes an element-to-element stack which in accordance with one aspect of the present description comprises a film interposer 102 which has columnar electrical interconnects 104 (FIG. 3) disposed in a body 106 of the film interposer 102. As described in greater detail below, the film interposer 102 facilitates optical communication between elements of the stack 100, and between elements on the printed circuit board 101 or elements coupled to the circuit board such as storage 107 and network 109.

In the illustrated embodiment, the body 106 of the film interposer 102 is a thin, multi-layer film which includes an electrically insulative material such as a polyimide. Polyimide materials are typically lightweight, flexible, and resistant to heat and chemicals. Polyimides may be compounded with various other materials such graphite or glass fiber reinforcements to provide appropriate properties such as a suitable flexural strength. It is appreciated that other organic and inorganic materials, such as thinned silicon, for example, may be used to form the body 106 of the film interposer 102, depending upon the particular application.

The printed circuit board 101 may be a single layer or multi-layered motherboard which has a plurality of conductive lines that provide communication between the circuits in the device 100 and other components mounted to the board 102. Alternatively, one or more of the CPU 52, memory 60 and controllers 62a, 62b . . . 62n may be disposed on other cards such as daughter cards or expansion cards coupled to a motherboard.

An operating system and various applications execute on the CPU 52 and reside in the memory 60. The content residing in memory 60 may be cached in accordance with known or subsequently developed caching techniques. Programs and data in memory 60 may be swapped into storage 107 as part of memory management operations. The computer 50 may comprise any computing device known in the art or subsequently developed, such as a mainframe, server, personal computer, workstation, laptop, handheld computer, telephony device, network appliance, virtualization device, storage controller, network controller, etc. Any CPU 52 and operating system known in the art or subsequently developed may be used.

The controllers 62a, 62b . . . 62n may include a system controller, peripheral controller, memory controller, hub controller, I/O bus controller, video controller, network controller, storage controller, etc. For example, a storage controller can control the reading of data from and the writing of data to the storage 107 in accordance with a storage protocol layer. The storage protocol of the layer may be any of a number of known or subsequently developed storage protocols. Data being written to or read from the storage 62 may be cached in accordance with known or subsequently developed caching techniques.

A network controller can include one or more protocol layers to send and receive network packets to and from remote devices over a network 109. The network 109 may comprise a Local Area Network (LAN), the Internet, a Wide Area Network (WAN), Storage Area Network (SAN), etc. Embodiments may be configured to transmit data over a wireless network or connection. In certain embodiments, the network controller and various protocol layers may employ the Ethernet protocol over unshielded twisted pair cable, token ring protocol, Fibre Channel protocol, etc., or any other network communication protocol known in the art or subsequently developed.

Figure 3:
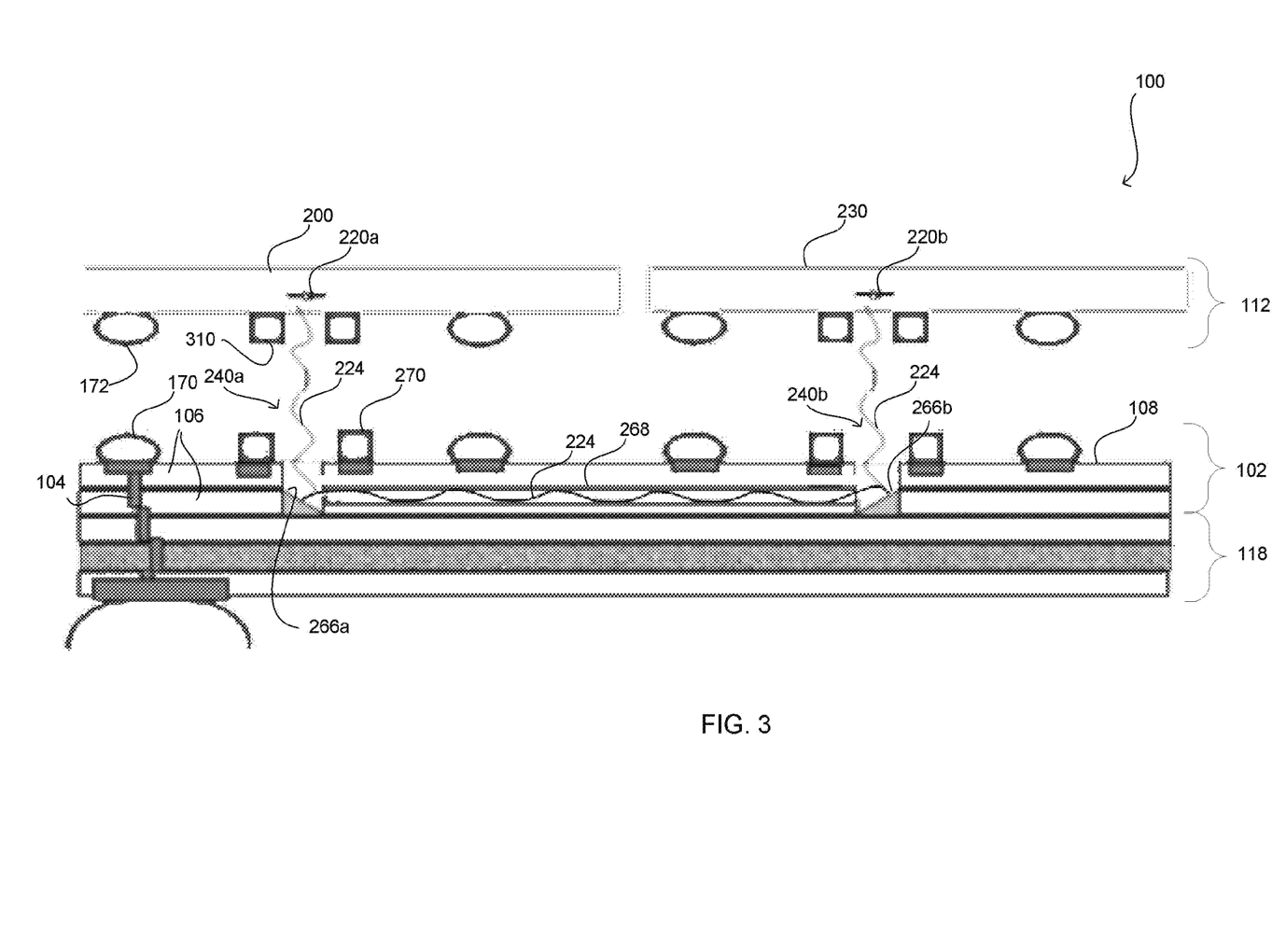
FIG. 3 is a partially exploded view of another embodiment of a stack utilizing a film interposer having photonic components in accordance with one embodiment of the present description.
Figure 4:
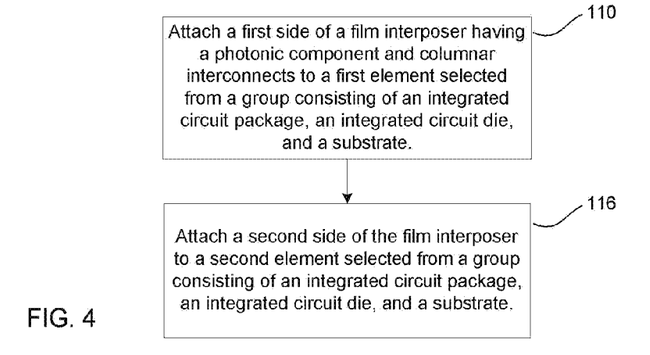
FIG. 4 illustrates one example of operations to form a stack having a film interposer in accordance with one embodiment of the present description.

FIG. 4 depicts one example of assembling a stack device 100 in accordance with one embodiment of the present description. In one operation, a front side 108 of a film interposer such as the film interposer 102, is attached (block 110) to a first element 112 of the stack device 100 which may be an integrated circuit package, an integrated circuit die, a substrate such as a printed circuit board, or other structure used to fabricate electronic devices. In addition, a back side 114 (FIG. 3) of the film interposer 102 is attached (block 116) to a second element 118 which like the first element 112, may be an integrated circuit package, an integrated circuit die, a substrate such as a printed circuit board, or other structure used to fabricate electronic devices. For integrated circuit devices which generate substantial heat, a heat sink or other heat transfer device may form part of the stack device 100. Also, in some applications, the stack 100 may also include a socket, for example.

As used herein, the term "front side" of the interposer 102 refers to the face 108 which faces toward the first element 112. Conversely, the term "back side" of the interposer 102 refers to the face 114 which faces toward the second element 118. In those embodiments having a printed circuit board 101 on which the device 100 is installed, the term "front side" of the interposer 102 refers to the face 108 which faces toward the first element 112 and away from the printed circuit board 101. Conversely, the term "back side" of the interposer 102 refers to the face 114 which faces toward the second element 118 and toward the printed circuit board 101.

In one aspect of the present description, the film interposer 102 may be fabricated so that it is not rigid but is instead relatively flexible prior to be installed on the elements of the stack 100. Accordingly, it is believed that the film interposer 102 can, in some applications, provide a degree of stress relief as one or more elements are mated with other elements for the stack 100. Thus, the film interposer 102 can act as a stress relief layer. Stress can develop as a result of malformed dies, packages or other substrates having a slight warpage, malformed contacts or other imperfectly formed features. It is believed that the film interposer 102 can provide a stress relief layer which conforms to a degree to an element 112, 118 when the film interposer 102 is attached to such an element 112, 118, thereby reducing stress and potentially reducing or eliminating damage to the devices resulting from stress which might be caused by directly coupling the first and second elements 112, 118 together without the film interposer 102.

In one embodiment, the film interposer 102 is relatively thin, such as 30 microns or less in thickness. It is believed that such a thin polyimide film interposer 102 may be relatively flexible to provide suitable stress relief to the components being assembled in the stock 100.

Figure 2:
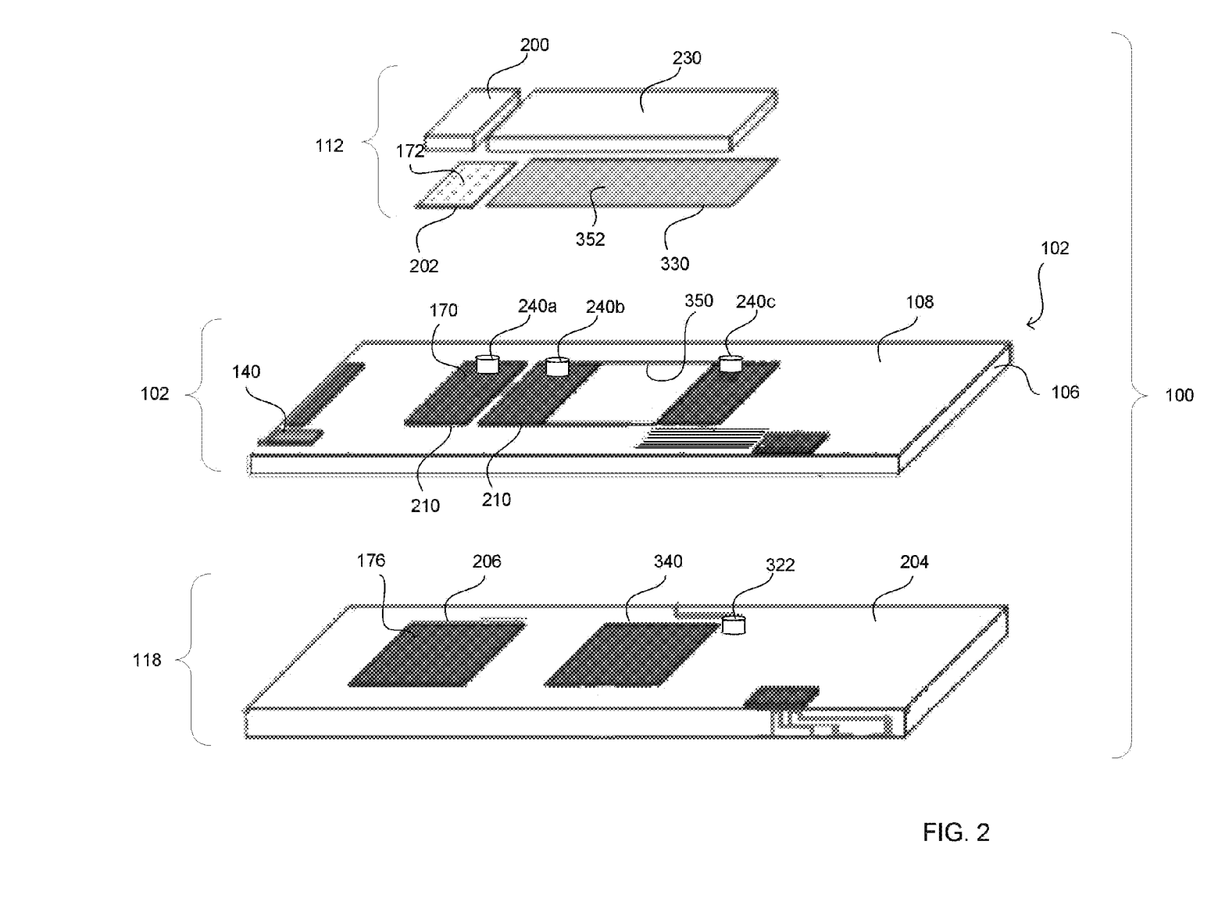
FIG. 2 is an exploded view of one embodiment of a stack utilizing a film interposer in accordance with one embodiment of the present description.

In another aspect of the present description, the film interposer 102 may include one or more photonic components to optically couple a photonic component in the first element 112 to a photonic component in the second element 118, or to a photonic component on the printed circuit board 101 or to a photonic component of an element coupled to the board 101 such as storage or a network. For example, the film interposer 102 of FIG. 2 is depicted as having a photonic component in the form of an optical cavity 240a which is positioned to receive an optical signal such as a laser emission from the first element 112 and direct the laser emission to an optical cavity of the second element 118 for processing by the second element 118. Other photonic components such as optical waveguides including optical fiber, may be embedded in the film interposer 102 to propagate or redirect the optical signal as needed. Suitable photonic components may be formed in the film 102 to perform a variety of optical functions in various optical modes including transmitting, receiving, multiplexed and split modes, for high speed communications between the first and second elements 112, 118.

In still another aspect, other devices may be formed on or in the film interposer 102 or otherwise attached to the film interposer 102. For example, FIG. 2 shows a Radio Frequency Identification Device (RFID) 140 embedded on the film interposer 102. The RFID 140 may be an RFID tag or antennae, for example. It is appreciated that other types of thin devices may be formed on or in the film interposer 102 or otherwise attached to the film interposer 102. For example, a communication connector or dongle for communicating to other devices via radio waves such as Wi-Fi, via electrical cables or via optical signals over optical fiber or other media may be disposed on the film interposer 102 as well, depending upon the particular application.

Figure 5:
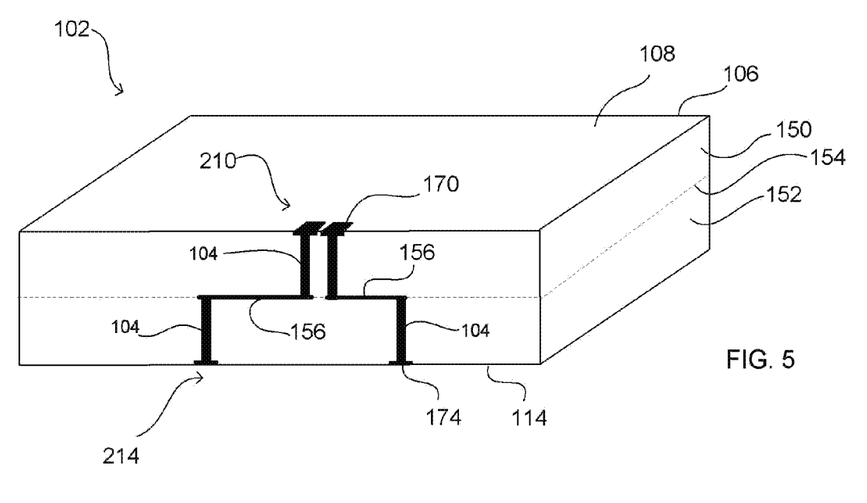
FIG. 5 is a diagram indicating various layers of one embodiment of a film interposer in accordance with one embodiment of the present description.
Figure 7A:
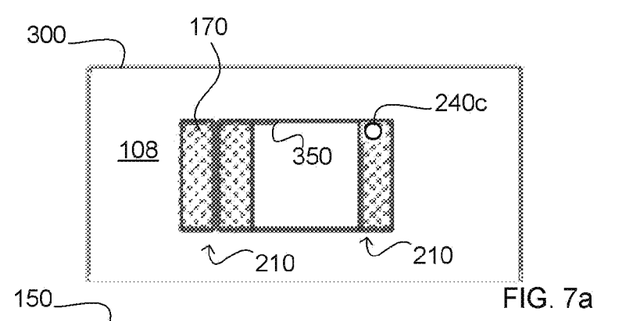
FIGS. 7a-e depict plan views of various layers of one embodiment of a film interposer in accordance with one embodiment of the present description.
Figure 7B:
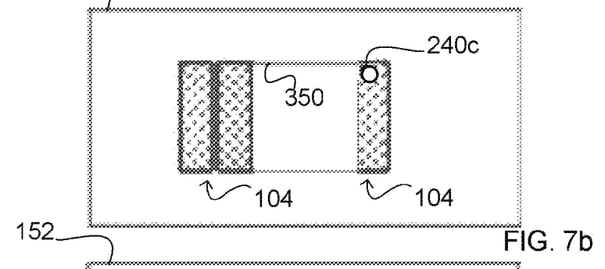

In yet another aspect of the present description, the film interposer 102 may include one or more interconnect layers including via or columnar interconnect layers and routing or lateral interconnect layers. FIG. 5 shows an example of a portion of a film interconnect 102 having thin via layers 150, 152 which are fabricated from thin polyimide film material. Each via layer 152, 154 includes one or more electrically conductive vias or columnar interconnects 104. FIG. 7b is a top view of one example of such a via layer 150 of a film interposer.

Figure 7C:
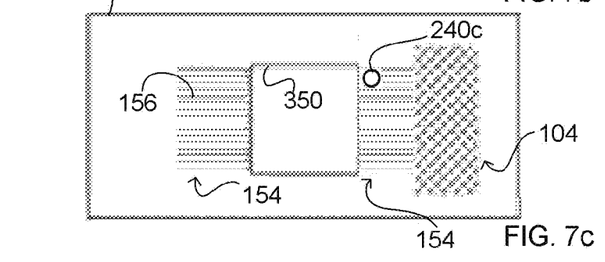

Disposed between the two via layers 150, 152 is a routing layer 154 of lateral conductive traces 156 which may be printed or otherwise formed on the polyimide film material of an adjacent layer. FIG. 7c is a top view of one example of a via layer 152 having a routing layer 154 lateral conductive traces 156 disposed between the via layers 150, 152.

The vias or columnar interconnects 104 are formed by depositing conductive material in a columnar opening formed through the via layer 150, 152. The columnar opening may be formed in the polyimide material of the via layer by suitable polyimide material removal operations including chemical operations such as etching, for example, mechanical operations such as punching or cutting using tools, or optical operations such as laser cutting the polyimide material. Thus, each columnar interconnect 104 passes at least partially through the body 106 of the film interposer 102 from one layer to another, to electrically interconnect conductors or other devices on different layers of the film interposer 102. Conversely, the lateral interconnects 156 electrically interconnect conductors and other features primarily within the same layer of the film interposer 102.

Thus, the first element 112 may be electrically coupled to the second element 118 through the columnar interconnects 104 and the lateral interconnects 156 of the film interposer 102. In the illustrated embodiment, as part of the electrical interconnection, electrical contacts 170 disposed on the front side 108 of the film interposer 102 and coupled to columnar interconnects 104, are bonded to electrical contacts 172 on the first element 112. Similarly, electrical contacts 174 disposed on the back side 114 of the film interposer 102 and coupled to columnar interconnects 104, are bonded to electrical contacts 176 (FIG. 2) on the second element 118.

In another aspect of the present description, the film interposer 102 may be used to facilitate the connection of high density input/output (I/O) pads, bumps or other electrical contacts of one element such as the first element 112, to relatively low density I/O contacts (including (I/O) pads or bumps) of another element, such as the second element 118. For example, in the embodiment depicted in exploded diagram of FIG. 2, the first element 112 includes a first integrated circuit die 200 on which a grid array of I/O contacts 202 such as a ball grid array, is formed. The spacing or pitch between individual contacts of the grid array 202 may be relatively fine due to the large number of contacts and the relatively small size of the integrated circuit die 200. Conversely, the second element 118 in the embodiment of FIG. 2 may include an integrated circuit package 204 having a grid array 206 of I/O contacts 176. As previously mentioned, in other embodiments, the second element 118 may be a printed circuit board or an integrated circuit die having a similar array of I/O contacts.

In contrast to the array 202 of I/O contacts 172 of the first element 112, the spacing or pitch between individual contacts of the grid array 206 may be relatively large due to various factors. For example, the design rules may be relatively loose or the process controls relatively poor for the grid array 206 of I/O contacts 176 of the second element 118, as compared to those for the grid array of I/O contacts of the first element 112. Frequently, relatively loose design rules and processes are not readily scaled to smaller contact pads and spaces. Also, power and ground contacts of the grid array 206 of I/O contacts 176 may benefit from being more widely spaced as compared to those for the grid array of I/O contacts of the first element 112.

Figure 7D:
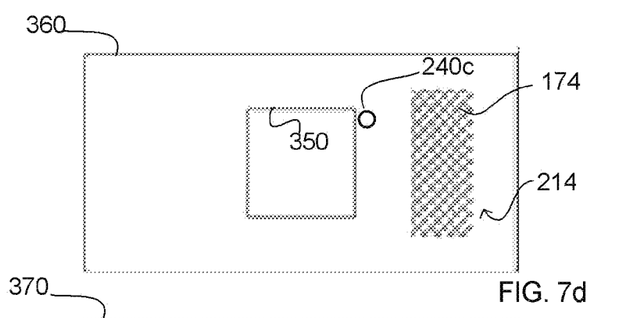

The film interposer 102 facilitates a fan out of high density signals of the first element 112 to relatively lower density signals of the second element 118. The film interposer 102 includes on the front side 108 a grid array 210 of I/O contacts 170 having a spacing or pitch between individual contacts 170 which, like those of the grid array 202 of the first element 112, may be relatively fine, to match those of the grid array 202 of the first element 112. Conversely, the film interposer 102 includes on the back side 114 a grid array 214 (FIG. 5) of I/O contacts 174 having a spacing or pitch between individual contacts 174 which, like those of the grid array 206 of the second element 118, may be relatively coarse or large, to match those of the grid array 206 of the first element 118. FIG. 7d shows an example of a grid array 214 (FIG. 5) of I/O contacts 174 in a contact layer on the back side 114 of the film interposer 102. The columnar interconnects 104 of the via layers 150, 152 and the lateral interconnects 156 of the routing layer or layers 154, electrically interconnect the I/O signals passing between the contacts 170 of the grid array 210 on the front side 108 of the film interposer 102, and the contacts 174 of the grid array 214 on the back side 114 of the film interposer 102.

It is believed that the nature of the film body 106 of the film interposer 102, facilitates control of interconnect geometries to permit closer spacing or pitch of conductive routing lines, vias and other electrical interconnects for higher routing density of interconnects to achieve a suitable fan out in escape routing areas as appropriate for the particular application. It is further believed that that the control over the interconnect geometries including trace dimension, facilitated by the nature of the film body 106 of the film interposer 102, may provide for reduced noise and inductance in routing layouts as well as reduction of signal paths, in some applications. Moreover, the electrical interconnects such as the lateral interconnects 156 may be fabricated onto the layers of the film interposer 102 in relatively thin traces, particularly in relatively low voltage or current applications, to maintain a degree of flexibility of the thin film interposer 102.

In accordance with another aspect of the present description, the film interposer 102 may also be used to facilitate the optical interconnection or coupling of a photonic component on one element such as the first element 112 disposed on the film interposer 102, to another element disposed on the film interposer 102. For example, in the embodiment depicted in exploded, cross-sectional diagram of FIG. 3, the first element 112 includes a first integrated circuit die 200 having a photonic component in the form of a laser diode transmitter/receiver 220a which emits an optical signal 224 in the form of a laser beam. The film interposer 102 can receive the optical signal 224 and reroute the optical signal 224 to another device of the first element 112 disposed on the front side 108 of the film interposer 102 such as a second integrated circuit 230 having another laser diode transmitter/receiver 220b.

Figure 6A:
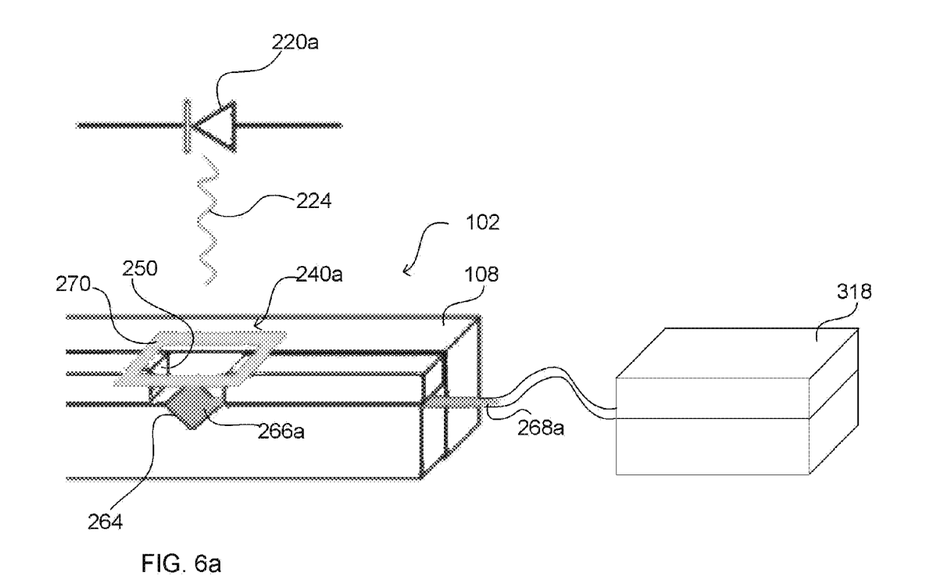
FIGS. 6a and 6b depict various alternative embodiments of photonic components disposed in film interposers in accordance with the present description.
Figure 6B:
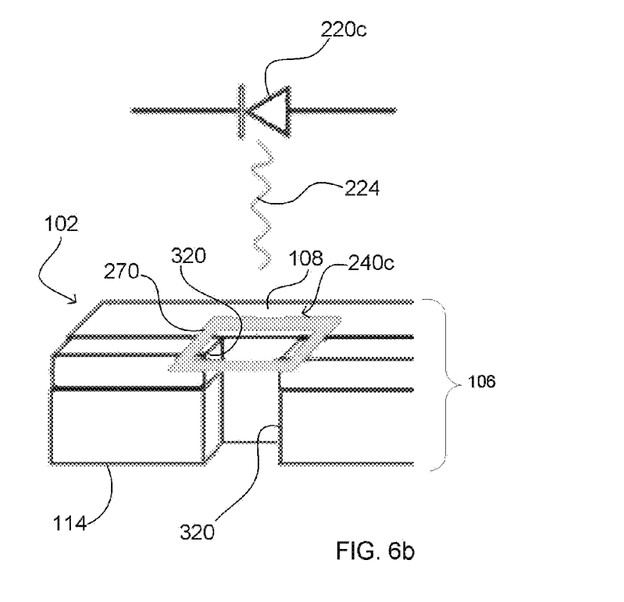

In the illustrated embodiment, as best seen in FIG. 6a, a photonic component in the form of an optical cavity 240a of the film interposer 102, is aligned with the laser diode transmitter/receiver 220a of the integrated circuit die 200 to receive the optical signal 224. In this manner, an optical signal may propagate between the photonic component 220a of the die 200 and the optical cavity 240a of the film interposer 102. The optical cavity 240a may be formed by creating a via opening 250 in one or more layers of the body 106 of the film interposer 102. The opening 250 may be formed in the front face 108 by suitable polyimide material removal operations including chemical operations such as etching, for example, mechanical operations such as punching or cutting using mechanical tools, or optical operations such as laser cutting, to remove the polyimide material to form the opening 250. The optical cavity may be filled with a suitable solid or gas medium such as a polymer or air, which is sufficiently transparent to the wavelengths of the optical signal 224.

In this embodiment, the bottom of the via opening is chamfered at an appropriate angle such as 45 degrees, for example, to form a reflector support surface 264 which may be coated with a suitable reflector material such as gold to form a reflector 266a to reflect the optical signal 224 to a waveguide 268 embedded in the body 106 of the film interposer. At the end of the waveguide 268 is a second optical cavity 240b (FIG. 3) having a second reflector 266b optically aligned with the photonic component 220b of the second integrated circuit die 230 of the first element 112, to reflect the optical signal 224 back through the front side 106 to the photonic component 220b of the second integrated circuit die 230 of the first element 112. Optical signals 224 can travel in both directions through the optical cavities 240a, 240b and the waveguide 268. In this manner, the film interposer 102 facilitates optical signal communication between the devices 200, 230 attached to the front side 108 of the film interposer 102, so that an optical signal may propagate between the photonic component of the device 200 and the photonic component of the device 230, through the optical cavity 240a, the waveguide 268 and the second optical cavity 240 of the film interposer 102.

In the illustrated embodiment, the waveguide 268 is made of an appropriate optically transmissive waveguide material such as a thin ribbon of optical fiber which may be embedded between layers of the body 106 of the film interposer 102. It is appreciated that a waveguide photonic component may be formed by etching or otherwise forming a channel in one or more layers of the film interposer 102 and coating the walls of the channel with a suitable optically reflective material if appropriate for that application. Alternatively, the waveguide channel may be filled with a suitable solid or gas medium such as a polymer or air, which is sufficiently transparent to the wavelengths of the optical signal 224. In yet another alternative, the waveguide can be formed from a direct spatial modulation of the optical index of refraction of the native interposer dielectric without the need for creation and filling of a channel. The index modulation could be achieved by spatially dependent doping of atoms or ions known to change the index of refraction of the material or by a spatially dependent exposure of a photochemically active dielectric material.

In the illustrated embodiment, the optical cavity 240a has an upstanding wall 270 encircling the opening 250 on the front face 108 of the film interposer 102. The wall 270 may be formed of solder or other suitable material in a top layer on the front face 108 of the film interposer 102. FIG. 7a shows a solder mask layer 300, for example, for an embodiment of the film interposer 102, in which the wall 270 of the cavity opening 240a is formed. As best seen in FIG. 3, the wall 270 may be bonded to a similar wall 310 encircling the output port of the laser device 220a of the die 200, to form a sealed conduit through which the laser signal 224 may pass from the die 200 to the film interposer 102. The optical cavity 240b may be formed in a similar manner.

In the embodiment depicted in FIG. 3, the waveguide 268 is internal to the film interposer 102. In an alternative embodiment, the film interposer 102 may have an external waveguide 268a (FIG. 6a) which is optically coupled to the internal waveguide 268 of the film interposer 102. The external waveguide 268a may be made of a suitable optically transmissive material such as an optical fiber. The external waveguide 268a may in turn be optically coupled to an external device 318 which is spaced from the film interposer 102 and also has a photonic component. Thus, the external device 318 may include a second film interposer like the film interposer 102, and has its own photonic component such as an internal waveguide similar to the waveguide 268 optically coupled to the external waveguide 268a. The second film interposer of the external device 318 may have various devices such as integrated circuit devices, integrated circuit packages and substrates such as the printed circuit board 101 attached to it in a manner similar to that of the film interposer 102. Alternatively, the external device 318 may lack a film interposer but include photonic components. In this manner, an optical signal may propagate between the photonic component 220a of the device 202 and the photonic component of the external device 318, through the external waveguide 268a, and the internal waveguide 268 and the optical cavity 240a of the first film interposer 102.

FIGS. 2, 6b and 7a-7e show another example of an optical cavity 240c. In this example, the optical cavity 240c has an opening 320 (FIG. 6b) which passes completely through all the layers of the body 106 of the film interposer 102. Thus, the film interposer 102 may also be used to facilitate the optical interconnection or coupling of a photonic component on one element such as the first element 112 disposed on the front side 108 of the film interposer 102, to the photonic component of another element disposed on the back side 114 of the film interposer 102. For example, in the embodiment depicted in the exploded diagram of FIG. 2, the first element 112 includes the integrated circuit die 230 having a laser diode transmitter/receiver 220c (FIG. 6b) which emits or receives an optical signal 224 in the form of a modulated laser beam. The optical cavity 240c of the film interposer 102 is optically aligned with the photonic component 220c. The optical cavity 240c can receive the optical signal 224 and permit the optical signal 224 to pass through the film interposer 102 to a device of the second element 118 disposed on the back side 114 of the film interposer 102 such as the integrated circuit package 204 (FIG. 2). In the illustrated embodiment, the optical cavity 240c of the film interposer 102, is also optically aligned with an optical cavity 322 of the integrated circuit package 204, which may have other photonic components such as an optical waveguide or an optical transmitter or receiver such as a laser diode transmitter/receiver. Thus, in this example, the photonic components 220c, 240c and 322 are optically aligned. In the illustrated embodiment, the optical signals 224 can travel in both directions through the optical cavities 240c and 322. In this manner, the film interposer 102 facilitates optical signal communication between the device 230 attached to the front side 108 of the film interposer 102, and the device 204 attached to the back side 114 of the film interposer 102 so that an optical signal may propagate between the photonic component of the device attached to the front side 108 of the film interposer 102, and the photonic component of the device attached to the back side 114 of the film interposer 102, through the optical cavity 240c of the film interposer, which is optically aligned with both of the photonic components 220c, 322.

Figure 8:
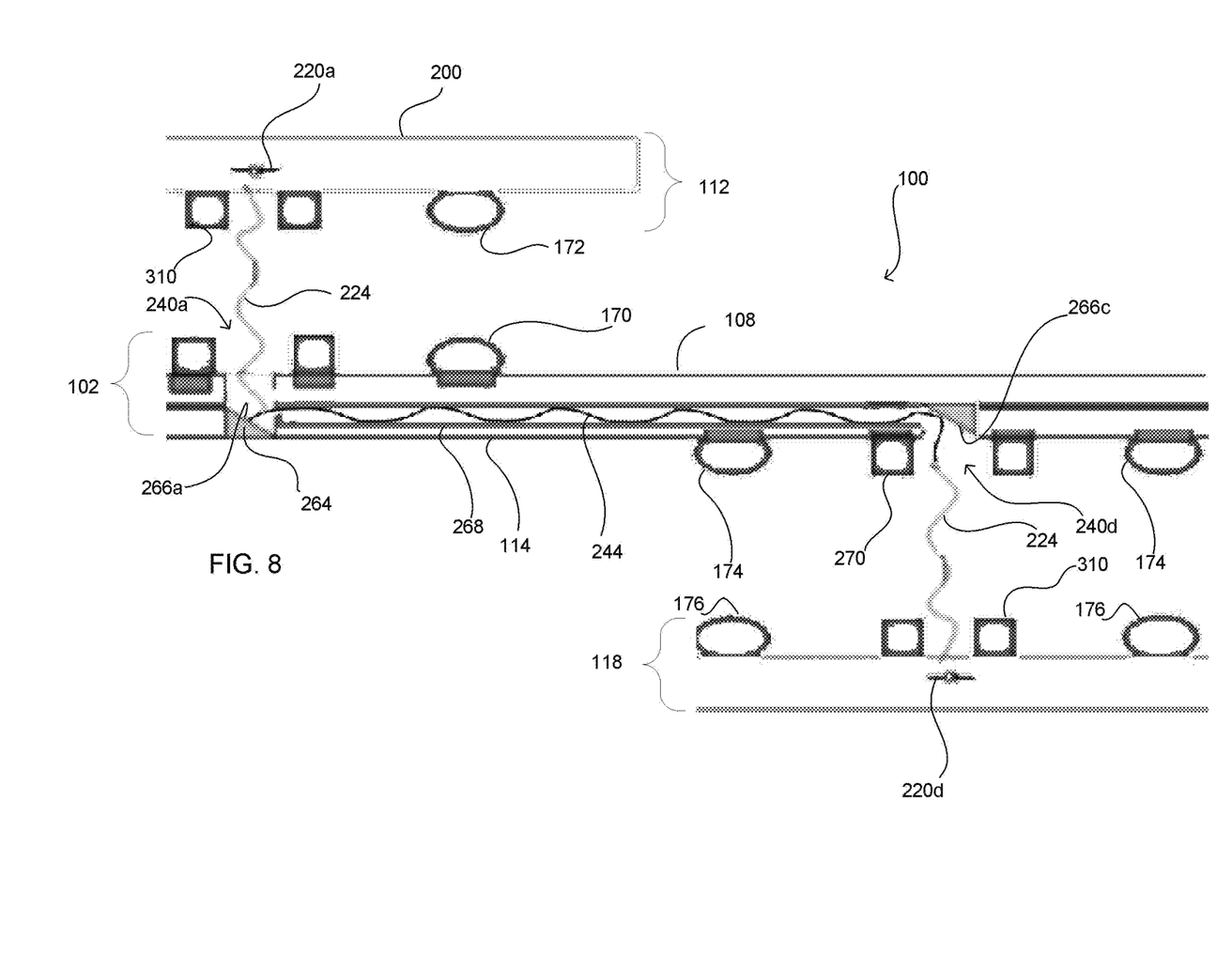
FIG. 8 is an exploded view of another embodiment of a stack utilizing a film interposer having photonic components in accordance with an embodiment of the present description.

FIG. 8 shows another example of an optical cavity 240d for the film interposer 102. In this example, the reflector 266c of the optical cavity 240d is vertically inverted relative to the reflector 266a of the optical cavity 240a. As a consequence, the optical signal 224 emerging from the waveguide 268 is reflected toward the back side 114 of the film interposer 102 instead of to the front side 108 in the example of FIG. 3. As a result, the film interposer 102 may be used to optically interconnect a first element 112 disposed on the front side 108, such as the integrated circuit die 200 having a photonic component 220a, to a second element 118 disposed on the back side 114, such as another integrated circuit die or package having another photonic component 220d such as a photodetector or transmitter/receiver for example. In this manner, the film interposer 102 again facilitates optical signal communication between a device of the first element 112 attached to the front side 108 of the film interposer 102, and a device of the second element 118 attached to the back side 114 of the film interposer 102. In this example, the photonic components 220a and 240a are optically aligned with each other and the photonic components 240c and 220d are optically aligned with each other. However, in this example, the photonic components of the first and second elements 112 and 118 need not be optically aligned with each other. In this manner, the reflector of the optical cavity 240d is optically aligned to a photonic component of a device attached to the back side 114 of the film interposer 102, so that an optical signal may propagate between the photonic component of a device attached to the front side 108 of the film interposer 102, and the photonic component of a device attached to the back side 114 of the film interposer 102, through the optical cavity 240a, the waveguide 268 and the optical cavity 240d of the film interposer 102.

In accordance with another aspect of the present description, the film interposer 102 may have a cavity which facilitates interconnecting contacts of the first element 112 directly to contacts of the second element 118. In the embodiment of FIG. 2, for example, the second element 112 includes the integrated circuit die 230 on which a grid array 330 of I/O contacts such as a ball grid array, is formed. Similarly, the second element 118 in the embodiment of FIG. 2 may include the integrated circuit package 204 having a grid array 340 of I/O contacts. As previously mentioned, in other embodiments, the second element 118 may be a printed circuit board or an integrated circuit die having a similar array of I/O contacts.

Figure 9:
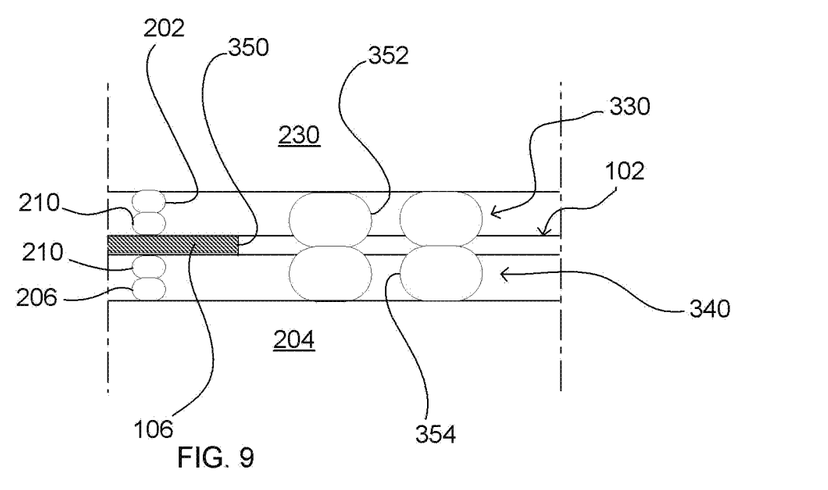
FIG. 9 is a partial cross-sectional view of another embodiment of a stack utilizing a film interposer having an interconnection cavity in accordance with an embodiment of the present description.

As best seen in the partial cross-sectional view of FIG. 9, the film interposer 102 has a contact interconnection cavity 350 formed in the body 106 which passes through all layers of the film interposer 102 as shown in the example of FIGS. 7a-7e. As a consequence, contacts 352 of the array 330 disposed on the integrated circuit die 230 of the first element 112, may extend into the contact interconnection cavity 350 of the film interposer 102, and bond to contacts 354 of the array 340 disposed on the integrated circuit package 204 of the second element, and also extending into the contact interconnection cavity 350 to engage and be bonded to the contacts 352 of the array 330 of the integrated circuit die 230. In this manner, the film interposer 102 permits in some embodiments, some contacts of the first element 112 to interconnect directly to some contacts of the second element 118, bypassing the via and lateral interconnects of the film interposer 102 completely.

FIGS. 7a-7e depict another example of various layers of a film interposer 102 in accordance with the present description. In this embodiment, the core layers of the film interposer 102 are the via layer 150 (FIG. 7b), the via layer 152 (FIG. 7c), and the routing layer 154 (FIG. 7c disposed between the via layers 150, 152. The front side 108 of the film interposer 102 is covered with a solder mask or other protective coating layer 300 as shown in FIG. 7a. A solder mask is typically a lacquer-like layer of polymer that provides a protective coating for routing traces, and other conductors, to prevent solder from bridging between conductors, thereby preventing short circuits. It is appreciated that in other embodiments, a mask layer may be omitted or other types of protective coatings may be used, depending upon the particular application.

For those contacts 170 of the array 210 on the front side 108 of the film interposer 102, which are to be bonded to the corresponding contacts 172, 352 of a first element 112, suitable openings may be provided in the mask layer 300 and solder or other electrical bonding agents may be deposited onto the contacts 170 within the mask layer 300. The film interposer 102 also has a contact layer 360 (FIG. 7d) on the back side 114 of the film interposer 102 which includes the array 214 of contacts 174. In a manner similar to that of the front side contacts 170, solder or other electrical bonding agent may be deposited onto the contacts 174 for bonding to the corresponding contacts 176 of a second element 118 such as the array 206 (FIG. 7f) of contacts 176 of the integrated circuit package 204. In some applications, a solder mask or other protective layer may be provided for the back side contact layer 360, depending upon the particular application.

Figure 7E:
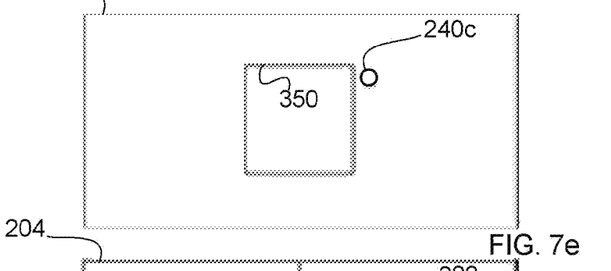
Figure 7F:
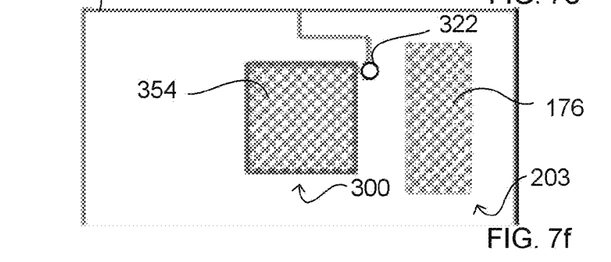
FIG. 7f depicts a plan view of an integrated circuit package for the interposer of FIGS. 7a-e.

In the illustrated embodiment, the electrical contacts 170, 174 on the film interposer 102 may be coated with a suitable conductive metal such as gold in preparation for the solder deposit. It is appreciated that in other applications, such coating metals may be omitted or other coating metals substituted, depending upon the particular application. As depicted in FIG. 7e, the back side 114 of the film interposer 102 may also be coated with a layer 370 of a suitable adhesive such as a B-stage adhesive, such as epoxy, for example, to facilitate bonding the back side 114 of the film interposer to the second element 118 such as the integrated circuit package 204. It is appreciated that in other applications, such back side adhesive materials may be omitted or other coating materials substituted, depending upon the particular application.

The film interposer 102 may be fabricated as a plurality of such interposers 102 on a continuous polyimide film. An individual interposer 102 may be separated (singulated) from the other interposers 102 on the same film and attached to an element such as the first element 112 or the second element 118. In one embodiment, the front side film interposer 102 can be connected directly first to the I/O bumps, pads or other contacts of the integrated circuit dies 200. 230 of the first element 112 before it is connected to an integrated circuit package of the second element 118.

It is believed that an initial connection of the film interposer 102 to the devices of the first element 118 without the presence of the second element 118 can reduce stress that may be exerted on the first element 112. As a result, stress related damage such as bump cracks or dielectric cracking which may occur in conventional stack assembly, may be reduced or avoided in some applications.

After placing the contacts 170 of the front side 108 of the film interposer 102 against the contacts 170, 352 of the dies 200, 230 of the first element 118, the contacts may be bonded together using any suitable bonding technique including using solder and thermo-compression bonds or flux and reflow.

The film interposer 102 with the dies 200, 230 bonded to it may be flipped onto the integrated circuit package 204 of the second element 118. In the illustrated embodiment, the integrated circuit package 204 may be, for example, a standard FCxGA package with micro-ball power/ground solder bumps that have been pre-fluxed. It is appreciated that the second element 118 may include other types of packages and dies. The film interposer 102 (with the dies 200, 230 bonded to it) is compressed or press-fit onto the package 204 with suitable tools such as soft rubber rollers or stamps, for example. Other devices such as memory integrated circuits and RFID circuit devices may be mounted to the film interposer 102 in connection with this operation.

The entire assembly may be is sent to a reflow furnace to complete the micro-ball connection to the package 204, complete the solder connection of the package 204 to the film interposer 102 and to complete the bonding of the b-stage adhesive layer 370 to the package 204. Other bonding techniques may be used, depending upon the particular application.

The assembly may be cleaned with solution based deflux or a "no-clean" flux may be used and cleaned as appropriate. Underfill or overmolding or both may be applied as appropriate to protect the assembly.

As previously mentioned, in some applications, the second element 118 may be a printed circuit board such as the printed circuit board 101, instead of or in addition to integrated circuit dies or packages. In such applications, the back side 114 of the film interposer 102 may be bonded to the printed circuit board 101 with dies or packages or both bonded to the front side 108 of the film interposer 102.

Additional Embodiment Details

In certain embodiments, the interposer embodiments may be embodied in a computer system including a video controller to render information to display on a monitor coupled to a computer system comprising a desktop, workstation, server, mainframe, laptop, handheld computer, etc. Alternatively, the interposer embodiments may be embodied in a computing device that does not include a video controller, such as a switch, router, etc.

The illustrated operations of FIG. 4 shows certain events occurring in a certain order. In alternative embodiments, certain operations may be performed in a different order, modified or removed. Moreover, operations may be added to the above described operations and still conform to the described embodiments. Further, operations described herein may occur sequentially or certain operations may be processed in parallel.

Figure 10:
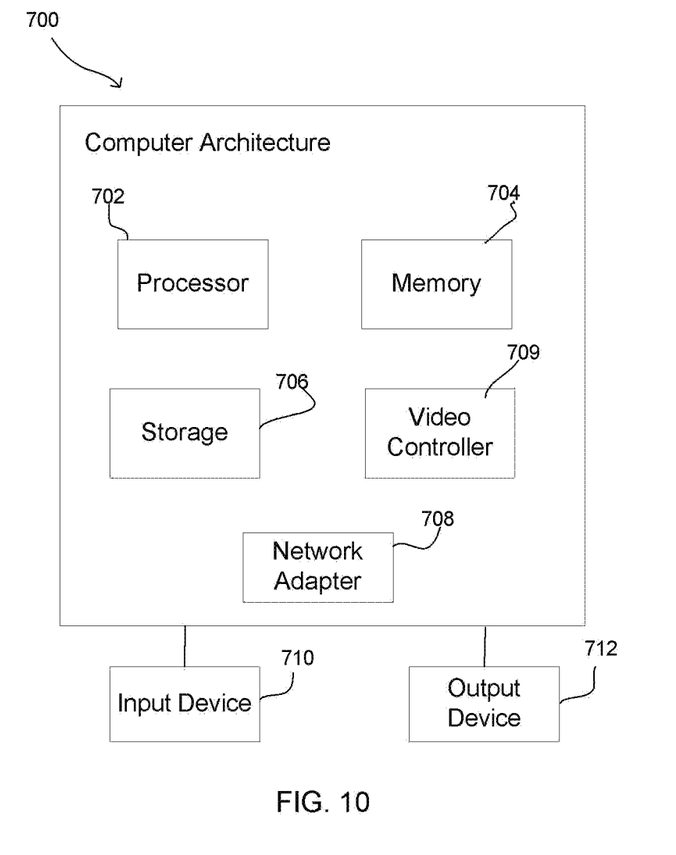
FIG. 10 illustrates an example of an architecture that may be used with the described embodiments.

FIG. 10 illustrates one embodiment of a computer architecture 700 which can utilize components, such the devices shown in the other figures. Accordingly, one or more components or devices may utilize a film interposer in accordance with the description provided herein.

The architecture 700 may include a processor 702 (e.g., a microprocessor), a memory 704 (e.g., a volatile memory device), and storage 706 (e.g., a non-volatile storage, such as magnetic disk drives, optical disk drives, a tape drive, etc.). The processor 702 may be mounted on a motherboard, for example. The storage 706 may comprise an internal storage device or an attached or network accessible storage. Programs in the storage 706 are loaded into the memory 704 and executed by the processor 702 in a manner known in the art. The architecture further includes a network adapter 708 to enable communication with a network, such as an Ethernet, a Fibre Channel Arbitrated Loop, etc. Further, the architecture may, in certain embodiments, include a video controller 709 to render information on a display monitor, where the video controller 709 may be embodied on a video card or integrated on integrated circuit components mounted on the motherboard. Certain of the devices may have multiple cards or controllers. An input device 710 is used to provide user input to the processor 702, and may include a keyboard, mouse, pen-stylus, microphone, touch sensitive display screen, or any other activation or input mechanism known in the art. An output device 712 is capable of rendering information transmitted from the processor 702, or other component, such as a display monitor, printer, storage, etc.

The network adapter 708 or other devices described herein may be mounted on an expansion card, such as a Peripheral Component Interconnect (PCI) card, PCI-express or some other I/O expansion card coupled to a motherboard, or on integrated circuit components mounted on the motherboard. Devices may be mounted directly to a card or may utilize a film interposer in accordance with the description provided herein. Thus, film interposer embodiments may be embodied in computer systems or other systems in which a film interposer in accordance with the present description is mounted on one or both of a motherboard and an expansion card. Accordingly, in some system embodiments, the system may lack an expansion card, and film a interposer in accordance with the present description may be mounted on a motherboard. In another system embodiment, a film interposer in accordance with the present description may be mounted on an expansion card but not on a motherboard.

The foregoing description of various embodiments has been presented for the purposes of illustration and explanation. It is not intended to be exhaustive or to limit to the precise form disclosed. Many modifications and variations are possible in light of the above teaching. For example, a film interposer in accordance with the present disclosure may be used to connect a die to a substrate.

What is claimed is:

1. A device, comprising:
   a first element selected from a group consisting of an integrated circuit package, an integrated circuit die, and a substrate, wherein said first element has a photonic component;
   a second element selected from a group consisting of an integrated circuit package, an integrated circuit die, and a substrate; and
   a film interposer having a body, a first side of the body attached to the first element, a second side of the body attached to the second element, a photonic component and a plurality of electrically conductive columnar interconnects disposed in and at least partially passing through the body of said film interposer, wherein said photonic component of said film interposer is optically aligned with the photonic component of the first element, wherein the photonic component of the film interposer includes a first optical cavity aligned with the photonic component of the first element so that an optical signal can be propagated between the photonic component of the first element and the first optical cavity of the film interposer, and wherein the second element has a photonic component aligned with the first optical cavity of the film interposer and with the photonic component of the second element, and wherein the first optical cavity passes entirely through the body of the film interposer and is adapted to propagate an optical signal between photonic components of the first and second elements and through the first optical cavity of the film interposer.

2. The device of claim 1 further comprising a third element selected from a group consisting of an integrated circuit package, an integrated circuit die, and a substrate, attached to one of said first side and said second sides of said film interposer and having a photonic component, wherein the film interposer further has an optical waveguide and a second optical cavity optically aligned with the photonic component of the third element, wherein each optical cavity has a reflector, wherein the optical reflector of the first optical cavity is adapted to reflect an optical signal between the first optical cavity of the film interposer and the waveguide of the film interposer, and the optical reflector of the second optical cavity is adapted to reflect an optical signal between the waveguide and the second optical cavity of the film interposer so that an optical signal may propagate between the photonic component of the first element and the photonic component of the third element, through the first optical cavity, the waveguide and the second optical cavity of the film interposer.

3. The device of claim 1 wherein the film interposer is a first film interposer and includes an internal waveguide, and wherein the first optical cavity includes a reflector oriented to reflect an optical signal between the first optical cavity of the first film interposer and the internal waveguide of the first film interposer, the device further comprising a third element external to and spaced from the first film interposer and the first and second elements, the third element having a photonic component and being selected from a group consisting of an integrated circuit package, an integrated circuit die, a substrate, and a second film interposer, said device further comprising a waveguide external to the first film interposer and optically coupling the internal waveguide of the first film interposer to the photonic component of the external third element so that an optical signal may propagate between the photonic component of the first element and the photonic component of the third element, through the external waveguide, and the internal wave guide and the first optical cavity of the first film interposer.

4. The device of claim 1 wherein said first element has electrical contacts, said second element has electrical contacts said film interposer has electrical contacts disposed on the first side which are bonded to the electrical contacts of the first element, and said film interposer has electrical contacts disposed on the second side of the film interposer, which are bonded to the electrical contacts of the second element, and wherein the first element is electrically coupled to the second element through the columnar interconnects which pass at least partially through the body of the film interposer.

5. The device of claim 4 wherein the film interposer defines a cavity passing through the body of the film interposer and wherein electrical contacts of the first element are bonded to electrical contacts of the second element, through the cavity defined by the body of the film interposer.

6. The device of claim 4 wherein electrical contacts on the first side of the film interposer have a first density and electrical contacts on the second side of the film interposer have a second density different from the first density.

7. The device of claim 1 wherein film interposer is flexible so the shape of the flexible film interposer on the first side conforms to the shape of the first element, the shape of the flexible film interposer on the second side conforms to the shape of the second element.

8. The device of claim 1 wherein the body of the film interposer includes at least one layer of polyimide material.

9. The device of claim 8 wherein the film interposer has a layer of electrical contacts on the first side of the film interposer, a columnar interconnect layer of columnar electrical interconnects passing through the at least one layer of polyimide material, a routing layer of lateral electrical interconnects disposed on the at least one polyimide layer, and a layer of electrical contacts on the second side of the film interposer.

10. The device of claim 9 wherein the film interposer further has a solder mask layer having solder bonding electrical contacts disposed on the first side of the film interposer to electrical contacts of the first element, and a layer of adhesive on the second side of the film interposer bonding the film interposer second side to the second element.

11. The device of claim 1 further comprising:
a motherboard wherein the first element, film interposer and second element are carried on the motherboard;
at least one system memory carried on the motherboard;
a controller carried on said motherboard;
an expansion card coupled to said motherboard; and
a controller carried on said expansion card.

12. A device for use with a first element selected from a group consisting of an integrated circuit package, an integrated circuit die, and a substrate; and a second element selected from a group consisting of an integrated circuit package, an integrated circuit die, and a substrate; the device comprising:
a film interposer having a body, a first side of the body adapted to be attached to the first element, a second side of the body adapted to be attached to the second element, a photonic component and a plurality of electrically conductive columnar interconnects disposed in and at least partially passing through the body of said film interposer, wherein said photonic component of said film interposer is adapted to be optically aligned with the photonic component of the first element, wherein the photonic component of the film interposer includes a first optical cavity adapted to be aligned with the photonic component of the first element so that an optical signal can be propagated between the photonic component of the first element and the first optical cavity of the film interposer, and wherein the second element has a photonic component adapted to be aligned with the first optical cavity of the film interposer and with the photonic component of the second element, and wherein the first optical cavity passes entirely through the body of the film interposer and is adapted to propagate an optical signal between photonic components of the first and second elements and through the first optical cavity of the film interposer.

13. The device of claim 12 for use with a third element selected from a group consisting of an integrated circuit package, an integrated circuit die, and a substrate, attached to one of said first side and said second sides of said film interposer and having a photonic component, wherein the film interposer further has an optical waveguide and a second optical cavity adapted to be optically aligned with the photonic component of the third element, wherein each optical cavity has a reflector, wherein the optical reflector of the first optical cavity is adapted to reflect an optical signal between the first optical cavity of the film interposer and the waveguide of the film interposer, and the optical reflector of the second optical cavity is adapted to reflect an optical signal between the waveguide and the second optical cavity of the film interposer so that an optical signal may propagate between the photonic component of the first element and the photonic component of the third element, through the first optical cavity, the waveguide and the second optical cavity of the film interposer.

14. The device of claim 12 wherein the film interposer is a first film interposer and includes an internal waveguide, and wherein the first optical cavity includes a reflector oriented to reflect an optical signal between the first optical cavity of the first film interposer and the internal waveguide of the first film interposer, the device further for use with a third element external to and spaced from the first film interposer and the first and second elements, the third element having a photonic component and being selected from a group consisting of an integrated circuit package, an integrated circuit die, and a substrate, said device further for use with a waveguide external to the first film interposer and optically coupling the internal waveguide of the first film interposer to the photonic component of the external third element so that an optical signal may propagate between the photonic component of the first element and the photonic component of the third element, through the external waveguide, and the internal wave guide and the first optical cavity of the first film interposer.

15. The device of claim 12 wherein said first element has electrical contacts, said second element has electrical contacts said film interposer has electrical contacts disposed on the first side which are adapted to be bonded to the electrical contacts of the first element, and said film interposer has electrical contacts disposed on the second side of the film interposer, which are adapted to be bonded to the electrical contacts of the second element, and wherein the first element may be electrically coupled to the second element through the columnar interconnects which pass at least partially through the body of the film interposer.

16. The device of claim 15 wherein the film interposer defines a cavity passing through the body of the film interposer and wherein electrical contacts of the first element may be bonded to electrical contacts of the second element, through the cavity defined by the body of the film interposer.

17. The device of claim 15 wherein electrical contacts on the first side of the film interposer have a first density and electrical contacts on the second side of the film interposer have a second density different from the first density.

18. The device of claim 12 wherein film interposer is flexible so the shape of the flexible film interposer on the first side is adapted to conform to the shape of the first element, and the shape of the flexible film interposer on the second side is adapted to conform to the shape of the second element.

19. The device of claim 12 wherein the body of the film interposer includes at least one layer of polyimide material.

20. The device of claim 19 wherein the film interposer has a layer of electrical contacts on the first side of the film interposer, a columnar interconnect layer of columnar electrical interconnects passing through the at least one layer of polyimide material, a routing layer of lateral electrical interconnects disposed on the at least one polyimide layer, and a layer of electrical contacts on the second side of the film interposer.

21. The device of claim 20 wherein the film interposer further has a solder mask layer having solder for bonding electrical contacts disposed on the first side of the film interposer to electrical contacts of the first element, and a layer of adhesive on the second side of the film interposer for bonding the film interposer second side to the second element.

* * * * *